(12) United States Patent
Kawakami et al.

(10) Patent No.: US 6,426,551 B1
(45) Date of Patent: Jul. 30, 2002

(54) COMPOSITE MONOLITHIC ELECTRONIC COMPONENT

(75) Inventors: Hiromichi Kawakami; Hirofumi Sunahara, both of Moriyama (JP)

(73) Assignee: Murata Manufacturing Co. Ltd (JP)

( * ) Notice: Subject to any disclaimer, the term of this patent is extended or adjusted under 35 U.S.C. 154(b) by 0 days.

(21) Appl. No.: 09/877,968

(22) Filed: Jun. 8, 2001

(30) Foreign Application Priority Data

Jun. 8, 2000 (JP) ........................................ 2000-172197

(51) Int. Cl.$^7$ .............................................. H01L 23/13
(52) U.S. Cl. ........................ 257/700; 257/703; 257/758; 257/759; 361/312; 361/321.1; 361/321.2; 361/321.3; 428/210
(58) Field of Search ................................. 257/700, 701, 257/702, 703, 758, 759; 438/125; 361/311, 312, 321.1, 321.2, 321.3, 321.4, 321.5, 320; 501/5, 32, 65, 66; 428/210

(56) References Cited

U.S. PATENT DOCUMENTS

| | | | | |
|---|---|---|---|---|
| 4,672,152 A | * | 6/1987 | Shinohara et al. | 174/68.5 |
| 4,777,092 A | * | 10/1988 | Kawakami et al. | 428/428 |
| 4,821,142 A | * | 4/1989 | Ushifusa et al. | 361/395 |
| 5,024,975 A | * | 6/1991 | Hartman | 501/65 |
| 5,206,190 A | * | 4/1993 | Jean et al. | 501/32 |
| 5,212,121 A | * | 5/1993 | Omata et al. | 501/32 |
| 5,242,867 A | * | 9/1993 | Lin et al. | 501/32 |
| 5,283,210 A | * | 2/1994 | Kata et al. | 501/32 |
| 5,342,674 A | * | 8/1994 | Tanei et al. | 428/209 |
| RE34,887 E | * | 3/1995 | Ushifusa et al. | 361/795 |
| 5,578,533 A | * | 11/1996 | Manabe et al. | 501/17 |
| 5,710,082 A | * | 1/1998 | Kawakami et al. | 501/65 |
| 5,766,741 A | * | 6/1998 | Kawakami et al. | 428/210 |
| 5,821,181 A | * | 10/1998 | Bethke et al. | 501/8 |
| 5,825,632 A | * | 10/1998 | Tanei et al. | 361/795 |
| 5,968,858 A | * | 10/1999 | Kawakami et al. | 501/14 |
| 5,998,314 A | * | 12/1999 | Sugimoto | 501/32 |
| 6,118,649 A | * | 9/2000 | Kawakami et al. | 361/321.5 |
| 6,118,671 A | * | 9/2000 | Tanei et al. | 361/795 |
| 6,228,196 B1 | * | 5/2001 | Sakamoto et al. | 156/89.17 |
| 6,241,838 B1 | * | 6/2001 | Sakamoto | 156/89.17 |
| 6,265,090 B1 | * | 7/2001 | Nishide et al. | 428/701 |
| 6,270,880 B1 | * | 8/2001 | Kawakami et al. | 428/210 |
| 6,316,374 B1 | * | 11/2001 | Kawakami et al. | 501/32 |

FOREIGN PATENT DOCUMENTS

| | | |
|---|---|---|
| EP | 0 281 220 A1 | 9/1988 |
| EP | 0 697 725 A2 | 2/1996 |
| GB | 2 360 036 A | 9/2001 |
| JP | 3-4594 * | 1/1991 |

* cited by examiner

Primary Examiner—David L. Talbott
Assistant Examiner—Alonzo Chambliss
(74) Attorney, Agent, or Firm—Dickstein, Shapiro, Morin & Oshinsky, LLP

(57) ABSTRACT

A composite monolithic electronic component has a laminate including a base layer having a relative dielectric coefficient of about 10 or less and a functional layer which is at least one of a high-dielectric-coefficient layer having a relative dielectric coefficient of about 15 or more and a magnetic layer. The base layer contains a crystallized glass containing $SiO_2$, MgO, $Al_2O_3$ and $B_2O_3$, and a ceramic oxide having a thermal expansion coefficient of about 6.0 ppm/°C. or more. The functional layer contains an amorphous glass having a softening point of about 800° C. or less.

16 Claims, 2 Drawing Sheets

COMPOSITE MONOLITHIC ELECTRONIC COMPONENT

BACKGROUND OF THE INVENTION

1. Field of the Invention

The present invention relates to composite monolithic electronic components comprising a sintered laminate formed by stacking and baking unsintered material layers composed of various types of materials. Specifically, the present invention relates to a composite monolithic electronic component provided in its interior with a passive device such as a capacitor and an inductor.

2. Description of the Related Art

Generally, insulative ceramic substrates are widely used for mounting various electronic components constituting electronic circuits in order to meet the demand for smaller electronic devices.

In order to further increase the mounting density and to withstand higher frequencies, a monolithic ceramic substrate prepared by baking a green laminate comprising a plurality of stacked ceramic green sheets, each of which is a low-dielectric-coefficient insulative ceramic layer having the relative dielectric coefficient of 15 or less, and interconnecting conductors composed of a conductive paste containing a low-resistance conductive substance such as Ag, Ag—Pd, Cu, Au or the like, which are patterned into a predetermined shape and which are provided on each of the ceramic green sheets, has been developed.

In order to further increase the mounting density from that of the substrate comprising the above-described low-dielectric-coefficient insulative ceramic layers, a substrate combining various types of materials, more particularly, a substrate comprising a dielectric layer having a relatively high dielectric coefficient and a functional layer, such as a magnetic layer having different permeability or a resistance layer having a different resistance, is desired since such a structure is capable of accommodating a passive element such as a capacitor, an inductor and/or a resistor, in an improved manner.

The aforementioned monolithic ceramic substrate comprising the low-dielectric-coefficient ceramic layers are mainly used in packages or circuits boards for mounting large-size IC chips comprising Si or Ga—As. In order to prevent the interface between the IC chip and the monolithic ceramic substrate from becoming defective due to thermal stresses, the thermal expansion coefficient of the low-dielectric-coefficient insulative material constituting the ceramic layers is set to approximately the same value as the thermal expansion coefficient of the IC chip (Si: 3.6 ppm/°C., Ga—As: 6.8 ppm/°C.).

In this respect, a composite material in which a glass such as borosilicate glass, borosilicate lead glass, lead silicate glass or the like, is added to a ceramic material such as alumina, cordierite, mullite or the like, is used as the low-dielectric-coefficient insulative material. Thus, it becomes possible to set the thermal expansion coefficient of the low-dielectric-coefficient insulative material to approximately the same value as that of the IC chip and to sinter the material at a temperature of 1,000° C. or less.

A multichip-module-type mounting substrate, that is, the circuit board (package) provided with a plurality of bare chips, will be more widely used as a high-density mounting module in the near future. Presently, when a flip chip is mounted on the mounting substrate, solder is used as an I/O interface to provide bonding. An interface portion (land portion) at which the flip chip contacts the mounting substrate is formed into a slope by a material having mechanical characteristics between that of the solder and that of each material. Moreover, an underfill material is provided after bonding in order to alleviate stresses. Alternatively, a conductive adhesive may be used to form the I/O termination in order to alleviate stresses.

In view of the above, the problem of defects due to thermal stresses at the interface between the IC chip and the monolithic ceramic substrate has been already solved.

In contrast, the thermal expansion coefficient of most of the high-dielectric-coefficient material constituting the dielectric layer having a relatively high dielectric coefficient in the above-described substrate combining various materials, except for PbO-based perovskite materials, is 8 ppm/°C. or more. The PbO-based perovskite material contains large amounts of PbO and is hazardous to the environment. The thermal expansion coefficient of most of the magnetic materials, i.e., ferrite, constituting the magnetic layer having different permeability is also 8 ppm/°C. or more.

The problems caused by the thermal stresses created when a passive element composed of a high-dielectric-coefficient material or a magnetic material, such as a capacitor or an inductor, is vertically or horizontally provided inside the monolithic substrate is more serious than problem created by the thermal stress between the IC chip and the mounting substrate. To be more specific, when the monolithic ceramic substrate is composed of various types of materials, the interface at which the different types of materials come into contact with each other is large compared to the interface between the IC chip and the substrate, and it is difficult to release the thermal stresses since the interface is located inside the monolithic ceramic substrate.

As a result, defects such as cracks which result from differences in thermal expansion coefficients, are likely to occur at the interfaces between the various different materials even when there is no defect at the IC chip.

SUMMARY OF THE INVENTION

Accordingly, it is an object of the present invention to provide a composite monolithic electronic component comprising a combination of different types of materials which overcomes the above-described problems.

This invention is directed to a composite monolithic electronic component comprising: a laminate having a base layer which is a low-dielectric-coefficient layer having a relative dielectric coefficient of about 10 or less and a functional layer which is a magnetic layer and/or a high-dielectric-coefficient layer having a relative dielectric coefficient of about 15 or more; and interconnecting conductors provided for the laminate. The laminate and the interconnecting conductors are simultaneously baked.

In order to solve the above-described technical problems, a low-dielectric-coefficient material having a high-thermal-expansion-coefficient is needed as the material of the base layer in the composite monolithic electronic component. The low-dielectric-coefficient material is also required to have mechanical strength.

One way to meet these needs is to use a crystallized glass having a relatively high mechanical strength in the base layer. However, when the crystallized glass is used in the base layer, dispersion from/to various types of materials, i.e., dispersion between the base layer and the functional layer, and wetting between the materials included in the base layers occurs, thereby causing a failure to obtain the desired crystallized substances. A crystallized glass which allows a desired crystal phase having a high-thermal expansion-coefficient to precipitate efficiently is needed.

Therefore, according to one aspect of the present invention, the base layer contains a crystallized glass comprising $SiO_2$, $MgO$, $Al_2O_3$ and $B_2O_3$, and an oxide ceramic having a thermal expansion coefficient of about 6.0 ppm/°C. or more. The functional layer contains an amorphous glass having a softening point of about 800° C. or less.

In this composite monolithic electronic component, a bondability is obtained by the crystallized glass contained in the base layer and the amorphous glass contained in the functional layer. When bonding is achieved in this manner, not only can the base layer and the functional layer be sintered at a low temperature of about 1,000° C. or less, but also residual stresses can be disregarded above the glass distortion point. By using a low-softening-point glass, the stresses occurring at the bonding interfaces (residual stresses) can be significantly decreased compared to a solid-state-reaction bonding if the thermal expansion coefficients of these layers at the time of the bonding are the same.

Preferably, the weight of $SiO_2$, $MgO$ and $Al_2O_3$ contained in the crystallized glass lies in the region defined by point A (44.0, 55.0, 1.0), point B (34.5, 64.5, 1.0), point C (35.0, 30.0, 35.0) and point D (44.5, 30.0, 25.5) in a ternary diagram illustrated in FIG. 2. The crystallized glass preferably contains about 2 to 20 parts by weight of $B_2O_3$ compared to 100 parts by weight of $SiO_2$, $MgO$ and $Al_2O_3$ in total.

More preferably, the weight of $SiO_2$, $MgO$ and $Al_2O_3$ contained in the crystallized glass lies in the region defined by point A (44.0, 55.0, 1.0), point B (34.5, 64.5, 1.0), point E (35.0, 45.0, 20.0) and point F (44.5, 35.5, 20.0) in the ternary diagram of FIG. 2.

The relationship between residual stresses and the sintering temperature during the sintering of the base layer and the functional layer is primarily defined by the glass viscosity, which is typically indicated by the glass softening point, and wettability between the glass and the dielectric/magnetic material. The glass viscosity, however, greatly affects inter-diffusion and the diffusion of the material constituting the interconnecting conductors when the different types of materials are bonded by sintering. Accordingly, when selecting a glass to be contained in the composite material comprising ceramic and glass, it is important to consider not only the residual stresses but also interdiffusion distances and electrical characteristics. Moreover, even if the temperature at which the residual stresses start to work is lowered, the alleviation of the stress may be limited depending on the combination of the thermal expansion coefficients of the ceramic and the glass and the difference in the Young coefficients thereof.

In this respect, in this invention, the base layer preferably has a crystal phase, such as forsterite and/or enstatite, having a high thermal expansion coefficient which is approximately the same as the thermal expansion coefficient of the high-dielectric-coefficient material such as $BaTiO_3$. In this manner, this residual stresses can be reduced below the glass distortion point.

Preferably, the functional layer has a thermal expansion coefficient of about 7 ppm/°C. or more, which is approximately the same with the thermal expansion coefficient of the base layer.

Furthermore, the interconnecting conductors may be made of at least one material selected from the group consisting of elemental Ag, an Ag—Pt alloy, an Ag—Pd alloy, elemental Au, elemental Ni and elemental Cu, since the composite monolithic electronic component of the present invention can be sintered at a temperature of about 1,000° C. or less.

DESCRIPTION OF THE PREFERRED EMBODIMENTS

Figure 1:
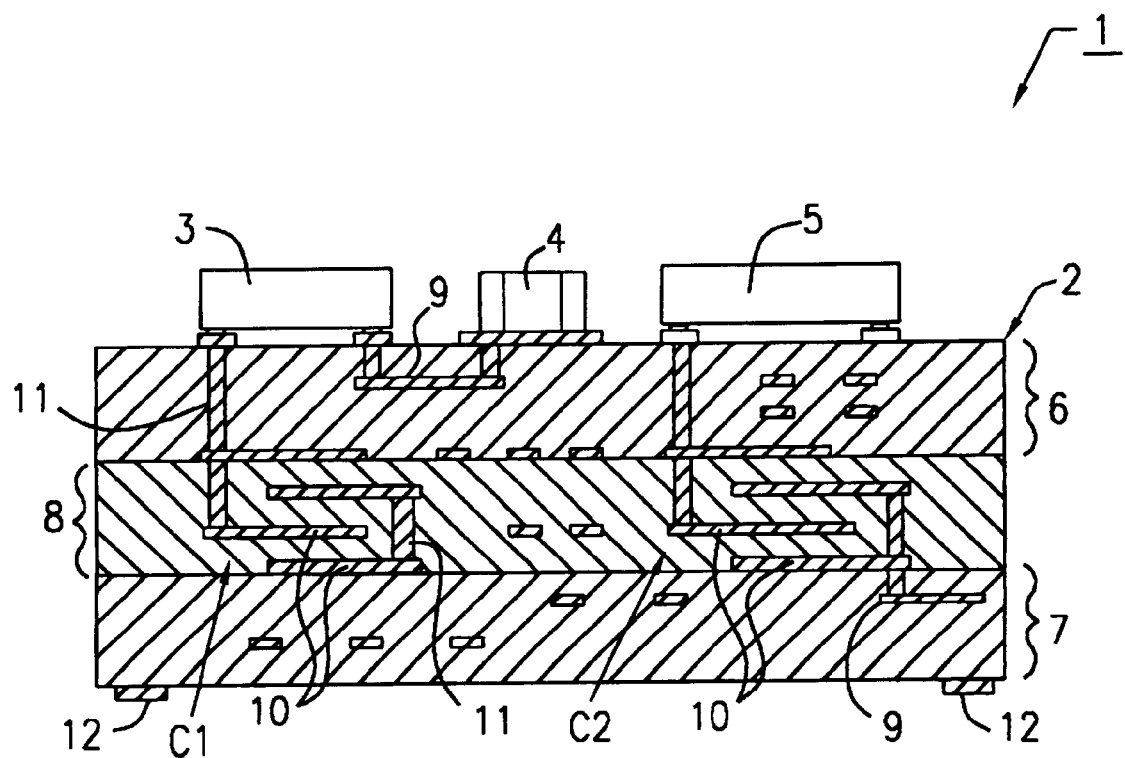
FIG. 1 is a cross-sectional view illustrating a composite monolithic electronic component 1 in accordance with an embodiment of the present invention.

FIG. 1 is a cross-sectional view illustrating a composite monolithic electronic component 1 in accordance with an aspect of the present invention.

The composite monolithic electronic component 1 comprises a laminate 2. Surface-mounting components 3, 4 and 5, such as semiconductor devices or chip capacitors, are mounted on the laminate 2 to form a ceramic composite module.

The laminate 2 comprises base layers 6 and 7, which are low-dielectric-coefficient layers each having a relative dielectric coefficient of about 10 or less, and a functional layer 8 which is a high-dielectric-coefficient layer having a relative dielectric coefficient of about 15 or more and is provided between the base layers 6 and 7. Although each of the base layers 6 and 7 and the functional layer 8 is illustrated as a single layer each in FIG. 1, a plurality of low-dielectric-coefficient sublayers and a plurality of high-dielectric-coefficient sublayers are generally provided to constitute these layers.

The laminate 2 has internal conductor layers 9 and 10, via-hole conductors 11, and external conductor layers 12. The internal conductor layers 10 provided in the functional layer 8, which is the high-dielectric-coefficient layer form capacitors C1 and C2. The internal conductor layers 9 and 10, the via-hole conductors 11, and the external conductor layers 12 form interconnecting conductors for providing electrical connection between the surface-mounting components 3 to 5 and internal capacitors C1 and C2.

The laminate 2 may be manufactured for example, by the following process.

First, a crystallized glass containing $SiO_2$—$MgO$—$Al_2O_3$—$B_2O_3$ as the main component is prepared as the material of the base layers 6 and 7. An oxide ceramic having a thermal expansion coefficient of 6.0 ppm/°C. or more, such as alumina, is then added to the crystallized glass and is mixed therewith. An organic binder, a dispersing agent, a plasticizer, an organic solvent and the like, are added to the resulting powder mixture and are mixed to obtain a slurry for making the low-dielectric-coefficient layers. The resulting slurry is then formed into sheets by the doctor blade process to obtain ceramic green sheets for making low-dielectric-coefficient layers.

Meanwhile, a $BaO$-$TiO_2$-type dielectric material is prepared as the material for the functional layer 8. The material is calcined at 1,000° C. for an hour and is then pulverized. An amorphous glass having a softening point of 800° C. or less such as $Me_2O$—$MaO$—$SiO_2$—$CuO$-type glass (wherein Me is alkali metal and Ma is alkaline earth metal)

is added to the calcined and pulverized material to prepare a material mixture. An organic binder, a dispersing agent, a plasticizer, an organic solvent and the like are added to the material mixture and are mixed to make a slurry for making the high-dielectric-coefficient layer. The resulting slurry is formed into sheets by the doctor blade process to obtain ceramic green sheets for making the high-dielectric-coefficient layer.

Next, through-holes are formed in the designated resulting ceramic green sheets which are used for making the low-dielectric-coefficient layers and the high-dielectric-coefficient layer. The through-holes are filled with a conductive paste or a conductive powder to form via-hole conductors 11.

A conductive paste is then applied, by printing, on the designated ceramic green sheets which are used for making the low-dielectric-coefficient layers and the high-dielectric-coefficient layer so as to form the internal conductor layers 9 and 10 and the external conductors 12.

Preferably, the conductive paste or the conductive powder used for forming the internal conductor layers 9 and 10 and the external conductor layers 12 contains at least one selected from elemental Ag, an Ag—Pt alloy, an Ag—Pd alloy, elemental Au, elemental Ni and elemental Cu as the main conductive component.

Next, a predetermined number of ceramic green sheets for making the low-dielectric-coefficient layers and the high-dielectric-coefficient layer are stacked in a predetermined order and are then pressed in the stacked direction so as to form a laminate block which will be used to form the laminate 2. If necessary, the laminate block may be cut to an appropriate size.

The resulting laminate block is sintered at a temperature in the range of about 800 to 1,000° C. to obtain the laminate 2 shown in FIG. 1.

Finally, the surface-mounting components 3, 4 and 5 are mounted on one main surface of the laminate 2 to complete the composite monolithic electronic component 1, which is a ceramic monolithic module.

In the composite monolithic electronic component 1 having the above-described configuration, because the capacitors C1 and C2 are formed in the functional layer 8 which is the high-dielectric-coefficient layer, the capacitance of the capacitors C1 and C2 can be easily increased. In other words, the volume of the capacitors C1 and C2 can be easily decreased. As a result, the performance of the composite monolithic electronic component 1 as the ceramic monolithic module can be easily improved and the size thereof can be easily reduced.

It is to be understood that the multi-layer configuration of the laminate 2 of the composite monolithic electronic component 1 shown in FIG. 1 is merely an example. Alternatively, the number of the base layers 6 and 7 and the functional layer 8 can be any number and the order for stacking the layers can be altered. Moreover, the functional layer 8 may be replaced with a magnetic material layer. In such a case, the interconnecting conductors formed in the functional layer 8 constitute, for example, an inductor. Furthermore, both the high-dielectric-coefficient layer and the magnetic material layer may be provided as the functional layers 8.

As described above, the base layers 6 and 7 contain the crystallized glass containing $SiO_2$—$MgO$—$Al_2O_3$—$B_2O_3$ as the main component, and a ceramic oxide, such as alumina, having a thermal expansion coefficient of about 6.0 ppm/°C. or more. The ratio of the components in the crystallized glass is preferably as follows.

Figure 2:
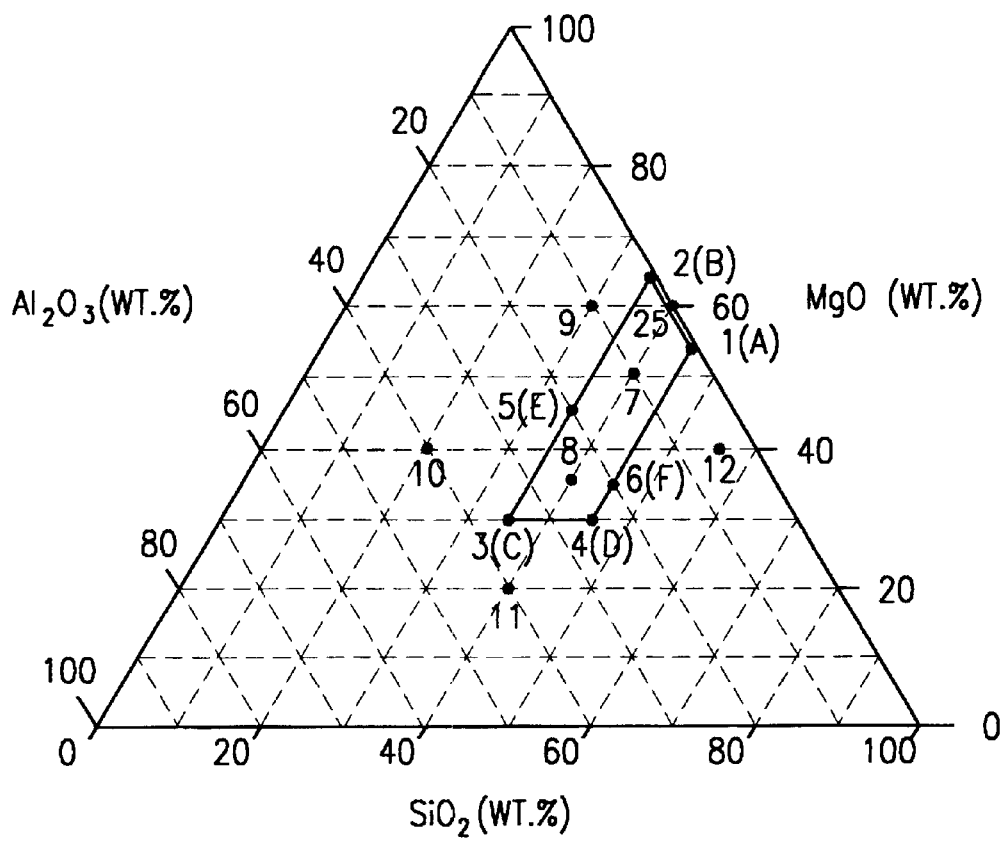
FIG. 2 is a ternary diagram showing ratio by weight of $SiO_2$ to $MgO$ to $Al_2O_3$ contained in a crystallized glass constituting the base layers 6 and 7 shown in FIG. 1.

FIG. 2 is a ternary diagram showing the amounts of $SiO_2$, MgO and $Al_2O_3$, on a weight basis, contained in the crystallized glass.

The amounts by weight of $SiO_2$, MgO and $Al_2O_3$ contained in the crystallized glass preferably lies in the region defined by point A (44.0, 55.0, 1.0), point B (34.5, 64.5, 1.0), point C (35.0, 30.0, 35.0) and point D (44.5, 30.0, 25.5) in the ternary diagram in FIG. 2. Preferably, the $B_2O_3$ content in the crystallized glass is about 2 to 20 parts by weight compared to the total content of $SiO_2$, MgO and $Al_2O_3$ which is 100 parts by weight.

More preferably, the weight of $SiO_2$, MgO and $Al_2O_3$ lies in the region defined by point A (44.0, 55.0, 1.0), point B (34.5, 64.5, 1.0), point E (35.0, 45.0, 20.0) and point F (44.5, 35.5, 20.0) in the ternary diagram in FIG. 2.

At least one forsterite crystal phase or enstatite crystal phase is preferably precipitated in the base layers 6 and 7. Since these crystal phases have high thermal expansion coefficients, residual stresses in the base layers 6 and 7 below the glass-distortion point can be reduced.

The thermal expansion coefficient of the functional layer 8 is preferably about 7 ppm/°C. or more.

EXAMPLES

1. Base Layers

The low-dielectric-coefficient layers constituting the base layers were examined.

First, $SiO_2$, $MgCO_3$, $Al_2O_3$ and $H_3BO_3$ were prepared as the starting material of the crystallized glass. The $SiO_2$, $MgCO_3$, $Al_2O_3$ and $H_3BO_3$ were then mixed at the weight ratios shown in Table 1. The resulting mixtures were melted to make glass melts. The glass melts were rapidly cooled by placing them into deionized water, and were then pulverized to obtain crystallized glass powders.

TABLE 1

| Sample No. | Glass Contents | | | | Reference |
|---|---|---|---|---|---|
| | $SiO_2$ | MgO | $Al_2O_3$ | $B_2O_3$ | |
| G1 | 44.0 | 55.0 | 1.0 | 10.0 | A |
| G2 | 34.5 | 65.4 | 1.0 | 10.0 | B |
| G3 | 35.0 | 30.0 | 35.0 | 10.0 | C |
| G4 | 44.5 | 30.0 | 25.5 | 10.0 | D |
| G5 | 35.0 | 45.0 | 20.0 | 10.0 | E |
| G6 | 45.5 | 35.5 | 20.0 | 10.0 | F |
| G7 | 40.0 | 50.0 | 10.0 | 10.0 | |
| G8 | 40.0 | 35.0 | 25.0 | 10.0 | |
| G9 | 30.0 | 60.0 | 10.0 | 10.0 | |
| G10 | 20.0 | 40.0 | 40.0 | 10.0 | |
| G11 | 40.0 | 20.0 | 40.0 | 10.0 | |
| G12 | 55.0 | 40.0 | 5.0 | 10.0 | |
| G13 | 34.5 | 64.5 | 1.0 | 0.0 | |
| G14 | 34.5 | 64.5 | 1.0 | 2.0 | |
| G15 | 34.5 | 64.5 | 1.0 | 20.0 | |
| G16 | 34.5 | 64.5 | 1.0 | 30.0 | |
| G17 | 40.0 | 50.0 | 10.0 | 0.0 | |
| G18 | 40.0 | 50.0 | 10.0 | 2.0 | |
| G19 | 40.0 | 50.0 | 10.0 | 20.0 | |
| G20 | 40.0 | 50.0 | 10.0 | 30.0 | |
| G21 | 35.0 | 30.0 | 35.0 | 0.0 | |
| G22 | 35.0 | 30.0 | 35.0 | 2.0 | |
| G23 | 35.0 | 30.0 | 35.0 | 20.0 | |
| G24 | 35.0 | 30.0 | 35.0 | 30.0 | |
| G25 | 40.0 | 60.0 | 0.0 | 0.0 | |
| G26 | 35.0 | 30.0 | 35.0 | 20.0 | |

An oxide ceramic powder, described below, was added to the crystallized glass powders in an amount of 10 parts by weight. An organic binder and a solvent were also added.

The mixtures were then thoroughly mixed in a ball mill so as to obtain evenly dispersed mixtures and were deaerated under a reduced pressure to make slurries.

In Samples G1 to G25, an alumina powder having a thermal expansion coefficient of about 6.0 ppm/°C. or more, more specifically, approximately 7.5 ppm/°C., was employed as the oxide ceramic powder. In Sample G26, cordierite having the thermal expansion coefficient of less than about 6.0 ppm/°C., more approximately 5.5 ppm/°C., was employed as the oxide ceramic powder.

The weights of $SiO_2$, MgO and $Al_2O_3$ in each of the Samples G1 to G12 and G25 in Table 1 is indicated by the dots in the ternary diagram in FIG. 2. The numbers given to the dots in the diagram correspond to the numerals following the letter G of the Samples.

The numbers 13 to 24 and 26 corresponding to the Samples G13 to G24 and G26 do not appear in FIG. 2. The weight of $SiO_2$, MgO and $Al_2O_3$ in each of the Samples G13 to G16 is the same as in Sample G2. The weight in each of the Samples 17 to 20 is the same as in the sample G7, and the weight in each of the samples G21 to G24 is the same as in the Sample G3.

Samples G1 to G6 are given the reference symbols A to F as shown in the reference column in Table 1 and the above-described weight combinations in each of the samples G1 to G6 is indicated by dots A to F in the ternary diagram in FIG. 2.

Ceramic green sheets each having thickness of 0.2 mm were formed on carrier films from the above-described slurries containing the crystallized glass powders G1 to G26 shown in Table 1 by a casting method using a doctor blade.

The ceramic green sheets were then dried, were separated from the carrier films and were punched to obtain ceramic green sheets having a predetermined size. A plurality of the ceramic green sheets were stacked and press-molded to obtain green ceramic compacts.

The green ceramic compacts were heated to 950° C. at a rate of 200° C. per hour and the temperature was maintained thereat for two hours to form sintered ceramic compacts.

The relative dielectric coefficient, insulation resistance, thermal expansion coefficient, sinterability and crystal phase of each of the resulting sintered ceramic compacts made from the sample crystallized glasses were examined.

The relative dielectric coefficient and insulation resistance were examined as follows. Square electrodes, 8×8 mm, were formed by applying and sintering an Ag-based material on two main surfaces of a sample compact whose size was 10×10×0.5 mm. Electrostatic capacitance was measured through these elect LCR meter under the conditions of frequency 1 MHZ, voltage 1 Vrms and a temperature of 25° C. The relative dielectric coefficient was calculated from the determined capacitance. The insulation resistance was measured 60 seconds after the application of a 50 V DC voltage.

In order to determine the thermal expansion coefficient, the sample compacts whose size was 2×2×10 mm were used and the average thermal expansion coefficient in the temperature range from 30° C. to 400° C. was measured.

The crystal phase was examined by X-ray diffraction in order to identify the X-ray diffraction pattern in the surfaces of the sample compacts.

The results are shown in Table 2.

TABLE 2

| Sample | Relative Dielectric Coefficient $\epsilon_r$ | Insulation Resistance log IR | Thermal Expansion Coefficient ppm/° C. | Sinterability | Presence of Crystal Phase | |
|---|---|---|---|---|---|---|
| | | | | | Forsterite | Enstatite |
| G1 | 6.7 | >9 | 13.1 | Satisfactory | Precipitated | Precipitated |
| G2 | 6.8 | >9 | 14.0 | Satisfactory | Precipitated | Precipitated |
| G3 | 6.7 | >9 | 6.5 | Satisfactory | Precipitated | Precipitated |
| G4 | 6.6 | >9 | 6.7 | Satisfactory | Precipitated | Precipitated |
| G5 | 6.6 | >9 | 7.9 | Satisfactory | Precipitated | Precipitated |
| G6 | 6.6 | >9 | 7.8 | Satisfactory | Precipitated | Precipitated |
| G7 | 6.7 | >9 | 8.6 | Satisfactory | Precipitated | Precipitated |
| G8 | 6.8 | >9 | 6.8 | Satisfactory | Precipitated | Precipitated |
| G9 | — | — | — | Not satisfactory | — | — |
| G10 | 7.1 | >9 | 5.3 | Satisfactory | Not Precipitated | Precipitated |
| G11 | 6.7 | >9 | 4.9 | Satisfactory | Precipitated | Precipitated |
| G12 | — | — | — | Not satisfactory | — | — |
| G13 | — | — | — | Not satisfactory | — | — |
| G14 | 6.9 | >9 | 14.5 | Satisfactory | Precipitated | Precipitated |
| G15 | 6.5 | >9 | 12.0 | Satisfactory | Precipitated | Precipitated |
| G16 | 6.3 | >9 | 9.9 | Satisfactory | Precipitated | Precipitated |
| G17 | — | — | — | Not satisfactory | — | — |
| G18 | 6.8 | >9 | 9.1 | Satisfactory | Precipitated | Precipitated |
| G19 | 6.5 | >9 | 8.0 | Satisfactory | Precipitated | Precipitated |
| G20 | 6.2 | >9 | 7.8 | Satisfactory | Precipitated | Precipitated |
| G21 | — | — | — | Not satisfactory | — | — |
| G22 | 6.8 | >9 | 6.7 | Satisfactory | Precipitated | Precipitated |
| G23 | 6.3 | >9 | 6.1 | Satisfactory | Precipitated | Precipitated |
| G24 | 6.3 | >9 | 5.8 | Satisfactory | Precipitated | Precipitated |

TABLE 2-continued

| Sample | Relative Dielectric Coefficient $\epsilon_r$ | Insulation Resistance log IR | Thermal Expansion Coefficient ppm/° C. | Sinterability | Presence of Crystal Phase Forsterite | Enstatite |
|---|---|---|---|---|---|---|
| G25 | — | — | — | Not satisfactory | — | — |
| G26 | 6.0 | >9 | 4.0 | Satisfactory | Precipitated | |

Referring to Table 2, the Samples G1 to G8, G14 to G16, G18 to G20, G22 and G23 exhibited satisfactory sinterability, low dielectric coefficient, high insulation resistance and high thermal expansion coefficient even when baked at a relatively low temperature of 950° C. Moreover, crystal phases of forsterite and enstatite were both precipitated.

In contrast, the Samples G9 to G12 whose the amounts of $SiO_2$, MgO and $Al_2O_3$ lie outside the region surrounded by points A to D in the ternary diagram in FIG. 2 had unsatisfactory sinterability and did not precipitate the forsterite crystal phase. The thermal expansion coefficient was also low.

Samples G13, G17 and G21 did not exhibit satisfactory sinterability because the crystallized glass used therein did not contain $B_2O_3$. Sample G25 also did not exhibit satisfactory sinterability because the crystallized glass used therein contained neither $Al_2O_3$ nor $B_2O_3$.

2. Functional Layer

The high-dielectric-coefficient layer and the magnetic layer constituting the functional layer were examined.

A $BaTiO_3$-type material was used as the dielectric material having a dielectric coefficient of about 15 or more, for forming the high-dielectric-coefficient layer. A $Li_2O$—BaO—CaO—SrO—$SiO_2$—CuO type amorphous glass having a softening point of 670° C. was used as the crystallized glass added to the $BaTiO_3$-type material.

A Ni—Zn ferrite material was used as the magnetic material for forming the magnetic layer. The same above-described amorphous glass was added to the Ni—Zn ferrite material as in the case of above-described dielectric material.

The above-described amorphous glass was added to the $BaTiO_3$ type material at the weight parts shown in Table 3. An organic binder and a solvent were further added. The mixture was then thoroughly mixed in a ball mill to obtain an evenly dispersed mixture, and was deaerated under reduced pressure so as to obtain slurries.

TABLE 3

| Sample No. | $BaTiO_3$-type material | $Me_2O$-MaO-$SiO_2$-CuO-type glass |
|---|---|---|
| B1 | 90 | 10 |
| B2 | 80 | 20 |
| B3 | 70 | 30 |
| B4 | 65 | 35 |

The amorphous glass was added to the Ni—Zn-type ferrite materials at the weight parts shown in Table 4 and underwent the same treatment as the above so as to obtain slurries.

TABLE 4

| Sample No. | Ni-Zn-type material | $Me_2O$-MaO-$SiO_2$-CuO-type glass |
|---|---|---|
| F1 | 95 | 5 |
| F2 | 90 | 10 |
| F3 | 80 | 20 |
| F4 | 70 | 30 |

Ceramic green sheets of 0.2 mm in thickness were formed on film surfaces using the above-described slurries by a casting method using a doctor blade. The ceramic green sheets were then dried, were separated from films and were punched to obtain the ceramic green sheets of predetermined size. A plurality of the ceramic green sheets was stacked and then press-molded to obtain green ceramic compacts.

The green ceramic compacts were heated to 950° C. at a rate of 200° C. per hour and the temperature was maintained for two hours in order to form sintered ceramic compacts.

The thermal expansion coefficient of each sample ceramic compact was examined. Using 2×2×10 mm ceramic compact samples, the average thermal expansion coefficient within the temperature range of 30° C. to 400° C. was measured.

The results are shown in Tables 5 and 6 below.

TABLE 5

| Sample No. | Thermal Expansion Coefficient ppm/° C. |
|---|---|
| B1 | 13.0 |
| B2 | 11.0 |
| B3 | 9.0 |
| B4 | 7.0 |

TABLE 6

| Sample No. | Thermal Expansion Coefficient ppm/° C. |
|---|---|
| F1 | 13.0 |
| F2 | 11.0 |
| F3 | 9.0 |
| F4 | 7.0 |

3. Laminate

Figure 3:
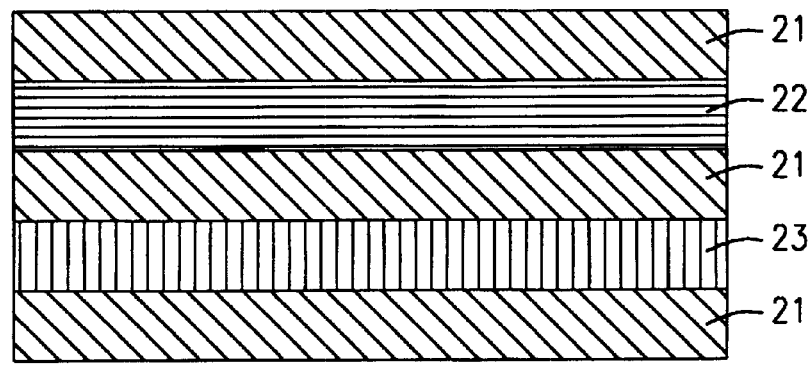
FIG. 3 is a cross-sectional view illustrating a laminate 24 according to an example of the present invention.

Referring to FIG. 3, a laminate 24 comprising low-dielectric-coefficient layers 21, a high-dielectric-coefficient layer 22 and a magnetic material layer 23 were fabricated in the following manner.

In order to form the low-dielectric-coefficient layer 21, the low-dielectric-coefficient green sheets of Samples G1 to G26 shown in Tables 1 and 2 were used. In order to form the high-dielectric-coefficient layer 22, the high-dielectric-coefficient green sheets of Samples B1 to B4 shown in Tables 3 and 5 were used. In order to form the magnetic material layer 23, the magnetic green sheets of Samples F1 to F4 shown in Tables 4 and 6 were used.

These green sheets were separated from film substrates on which they had been prepared and were punched to obtain green sheets of 12 mm in width and 12 mm in length.

The low-dielectric-coefficient green sheets, the high-dielectric-coefficient green sheets and the magnetic green sheets were stacked and then press-bonded in the combinations shown in Table 7 and in the order shown in FIG. 3, so as to obtain the laminates 24 having a thickness of 3 mm, each comprising the low-dielectric-coefficient layers 21, the high-dielectric-coefficient layer 22 and the magnetic material layer 23.

The resulting laminate blocks were heated to 950° C. for 30 minutes to obtain the laminates 24, one of which is shown in FIG. 3.

Sinterability and bondability of each of the laminate blocks and the presence of cracks at the bonding interfaces thereof were examined. The results are shown in Table 7.

The plies of laminate 24 using Sample 26 did not bond.

Samples 16 and 20, having an increased amount of $B_2O_3$, were likely to have degraded weather resistance (moisture resistance).

As apparent from the above, the composite monolithic electronic component in accordance with the present invention when fabricated by sintering at a temperature below about 1,000° C., exhibits superior bondability between the base layers and functional layers composed of different materials, and resists the occurrence of failure such as cracks, and is thus highly reliable.

What is claimed is:

1. A composite monolithic electronic component which comprises
    a fired laminate comprising a base layer which is a low-dielectric-coefficient material layer having a relative dielectric coefficient of about 10 or less and a functional material layer which is at least one member of the group consisting of a high-dielectric-coefficient material layer having a relative dielectric coefficient of at least about 15 and a magnetic material layer; and interconnecting conductors,

TABLE 7

| Sample No. | Low-dielectric-coefficient layer | High-dielectric-coefficient layer | Magnetic layer | Sinterability | Bondability | Presence of cracks |
|---|---|---|---|---|---|---|
| 1 | G1 | B1 | F1 | Excellent | Excellent | None |
| 2 | G2 | B1 | F1 | Excellent | Excellent | None |
| 3 | G3 | B4 | F4 | Excellent | Excellent | None |
| 4 | G4 | B4 | F4 | Excellent | Excellent | None |
| 5 | G5 | B4 | F4 | Excellent | Excellent | None |
| 6 | G6 | B4 | F4 | Excellent | Excellent | None |
| 7 | G7 | B3 | F3 | Excellent | Excellent | None |
| 8 | G8 | B4 | F4 | Excellent | Excellent | None |
| 9 | G9 | B1 | F1 | Not Satisfactory | Not Satisfactory | Few |
| 10 | G10 | B4 | F4 | Excellent | Excellent | Few |
| 11 | G11 | B4 | F4 | Excellent | Not Satisfactory | Few |
| 12 | G12 | B1 | F1 | Not Satisfactory | Not Satisfactory | Few |
| 13 | G13 | B1 | F1 | Not Satisfactory | Not Satisfactory | Few |
| 14 | G14 | B1 | F1 | Excellent | Excellent | None |
| 15 | G15 | B2 | F2 | Excellent | Excellent | None |
| 16 | G16 | B3 | F3 | Excellent | Excellent | None |
| 17 | G17 | B4 | F4 | Not Satisfactory | Not Satisfactory | Few |
| 18 | G18 | B3 | F3 | Excellent | Excellent | None |
| 19 | G19 | B3 | F3 | Excellent | Excellent | None |
| 20 | G20 | B4 | F4 | Excellent | Excellent | None |
| 21 | G21 | B4 | F4 | Not Satisfactory | Not Satisfactory | Few |
| 22 | G22 | B4 | F4 | Excellent | Excellent | None |
| 23 | G23 | B4 | F4 | Excellent | Excellent | None |
| 24 | G24 | B4 | F4 | Excellent | Excellent | Few |
| 25 | G25 | B1 | F1 | Not Satisfactory | Not Satisfactory | Few |
| 26 | G26 | B1 | F1 | Excellent | Poor | — |

Referring to Table 7, the laminate 24 using any one of Samples 1 to 8, 14, 15, 18, 19, 22 and 23 exhibited superior sinterability and bondability and no cracks were found in the bonding interfaces.

In contrast, the laminates using Samples 10, 11 and 24 had small cracks at the bonding interfaces.

The laminates 24 using Samples 9, 12, 13, 17, 21 and 25 exhibited degraded sinterability and bondability and small cracks were found at the bonding interfaces thereof.

wherein the base layer comprises a crystallized glass comprising $SiO_2$, MgO, $Al_2O_3$ and $B_2O_3$, and a ceramic oxide having a thermal expansion coefficient of at least about 6.0 ppm/°C.; and wherein the functional layer comprises an amorphous glass having a softening point of about 800° C. or less.

2. A composite monolithic electronic component according to claim 1,
    wherein the weight of the $SiO_2$, MgO and $Al_2O_3$ contained in the crystallized glass lies in the region defined by point A (44.0, 55.0, 1.0), point B (34.5, 64.5, 1.0), point C (35.0, 30.0, 35.0), and point D (44.5, 30.0, 25.5) in a ternary diagram, and wherein the crystallized glass contains about 2 to 20 parts by weight of $B_2O_3$ relative to 100 parts by weight of the total of $SiO_2$, MgO, and $Al_2O_3$.

3. A composite monolithic electronic component according to claim 2, wherein the weight of the $SiO_2$, MgO and $Al_2O_3$ contained in the crystallized glass lies in the region defined by point A (44.0, 55.0, 1.0), point B (34.5, 64.5, 1.0), point E (35.0, 45.0, 20.0), and point F (44.5, 35.5, 20.0).

4. A composite monolithic electronic component according to claim 3, wherein the base layer comprises a precipitated crystal phase which is at least one of forsterite and enstatite.

5. A composite monolithic electronic component according to claim 4, wherein the functional layer has a thermal expansion coefficient of at least about 7 ppm/°C.

6. A composite monolithic electronic component according to claim 2, wherein the base layer comprises a precipitated crystal phase which is at least one of forsterite and enstatite.

7. A composite monolithic electronic component according to claim 6, wherein the functional layer has a thermal expansion coefficient of at least about 7 ppm/°C.

8. A composite monolithic electronic component according to claim 1, wherein the base layer comprises a precipitated crystal phase which is at least one of forsterite and enstatite.

9. A composite monolithic electronic component according to claim 1, wherein the functional layer has a thermal expansion coefficient of at least about 7 ppm/°C.

10. A composite monolithic electronic component according to claim 1, wherein the interconnecting conductors comprise at least one member selected from the group consisting of elemental Ag, an Ag—Pt alloy, an Ag—Pd alloy, elemental Au, elemental Ni and elemental Cu.

11. A composite monolithic electronic component according to claim 1, wherein the base layer comprises a plurality of low-dielectric-coefficient material layers and the functional material layer comprises a plurality of the at least one member of the group consisting of a high-dielectric-coefficient material layer and magnetic material layer.

12. A composite monolithic electronic component according to claim 11, having at least one capacitor disposed in the interior of the laminate and wherein the interconnection conductors electrically connect the capacitor to an exterior surface of the laminate.

13. A composite monolithic electronic component according to claim 11, having at least one inductor disposed in the interior of the laminate and wherein the interconnection conductors electrically connect the inductor to an exterior surface of the laminate.

14. A composite monolithic electronic component according to claim 1, having at least one capacitor disposed in the interior of the laminate and wherein the interconnection conductors electrically connect the capacitor to an exterior surface of the laminate.

15. A composite monolithic electronic component according to claim 1, having at least one inductor disposed in the interior of the laminate and wherein the interconnection conductors electrically connect the inductor to an exterior surface of the laminate.

16. A composite monolithic electronic component according to claim 1, having a second low-dielectric-coefficient material layer having a relative dielectric coefficient of about 10 or less disposed such that the functional material layer is sandwiched between the two low-dielectric-coefficient material layers.

* * * * *